US011652723B2

(12) United States Patent
Burchard et al.

(10) Patent No.: US 11,652,723 B2
(45) Date of Patent: May 16, 2023

(54) WIRELESS COMMUNICATION WITH TIME-DELAY REPETITION DETECTION

(71) Applicant: NXP B.V., Eindhoven (NL)

(72) Inventors: Artur Tadeusz Burchard, Eindhoven (NL); Vincent Pierre Martinez, Roques (FR); Alessio Filippi, Eindhoven (NL)

(73) Assignee: NXP B.V., Eindhoven (NL)

( * ) Notice: Subject to any disclaimer, the term of this patent is extended or adjusted under 35 U.S.C. 154(b) by 279 days.

(21) Appl. No.: 17/006,982

(22) Filed: Aug. 31, 2020

(65) Prior Publication Data

US 2021/0092038 A1    Mar. 25, 2021

(30) Foreign Application Priority Data

Sep. 23, 2019  (EP) .................................. 19306166

(51) Int. Cl.
*H04L 43/16*      (2022.01)
*H04W 4/40*       (2018.01)
*H04L 1/08*       (2006.01)
*H04W 24/08*      (2009.01)

(52) U.S. Cl.
CPC ............... *H04L 43/16* (2013.01); *H04L 1/08* (2013.01); *H04W 4/40* (2018.02); *H04W 24/08* (2013.01)

(58) Field of Classification Search
CPC ......... H04L 43/16; H04L 1/08; H04L 1/1829; H04W 4/40; H04W 24/08; H03M 13/09; H03M 13/3769
See application file for complete search history.

(56) References Cited

U.S. PATENT DOCUMENTS

| 8,027,402 | B2 | 9/2011 | Lee et al. |
| 8,121,209 | B2 | 2/2012 | Lee et al. |
| 2003/0050720 | A1 | 3/2003 | Kolessar et al. |
| 2003/0112780 | A1 | 6/2003 | Ouyang et al. |

(Continued)

FOREIGN PATENT DOCUMENTS

| EP | 3282591 A1 | 2/2018 |
| EP | 3282618 A1 | 2/2018 |
| WO | 0054437 A2 | 9/2000 |

OTHER PUBLICATIONS

Non-final office action dated Jan. 4, 20222 in U.S. Appl. No. 17/006,998.

(Continued)

*Primary Examiner* — Abdullahi Ahmed

(57) ABSTRACT

Aspects of the present disclosure are directed to ascertaining whether data messages are repetitions of a previous data message. As may be implemented in accordance with one or more embodiments characterized herein, data packets (130/131) are received (102) and which use a first time delay relative to transmission of a previous data packet (120/121) by a different transmitter. Repetitions (110A/111A) of data packets are also received (102), and which use a second time delay relative to transmission of a previous data packet (110/111) by the same transmitter. The second time delay is less than the first time delay. The received packet is identified (102) as being a repetition of an immediately-previous data packet based on a time delay between the data packet and the immediately-previous data packet, relative to the first and second time delays.

20 Claims, 4 Drawing Sheets

(56) References Cited

U.S. PATENT DOCUMENTS

| | | |
|---|---|---|
| 2006/0133281 A1* | 6/2006 | Witherell .............. H04L 69/163 |
| | | 370/238 |
| 2007/0250751 A1 | 10/2007 | Cai et al. |
| 2008/0025427 A1 | 1/2008 | Lee et al. |
| 2008/0247355 A1 | 10/2008 | Ahn |
| 2009/0238289 A1 | 9/2009 | Sampath et al. |
| 2014/0269605 A1 | 9/2014 | Pecen et al. |
| 2017/0237632 A1 | 7/2017 | Hegde et al. |
| 2017/0279472 A1 | 9/2017 | Wong et al. |
| 2020/0044789 A1 | 2/2020 | Beale et al. |
| 2020/0053706 A1* | 2/2020 | Sadeghi .............. H04W 72/044 |
| 2020/0132829 A1* | 4/2020 | Jiang .................... G01S 13/762 |
| 2020/0335183 A1 | 10/2020 | Tommasi et al. |
| 2021/0006449 A1 | 1/2021 | Zhibo et al. |
| 2021/0076356 A1* | 3/2021 | Zhang .................... H04W 4/44 |
| 2021/0091889 A1* | 3/2021 | Martinez ............... H04L 5/0094 |
| 2021/0211242 A1 | 7/2021 | Andgart |
| 2021/0266910 A1 | 8/2021 | Yliuntinen et al. |
| 2021/0328716 A1 | 10/2021 | Noh et al. |
| 2022/0255693 A1* | 8/2022 | Lou ................... H04L 25/03146 |

OTHER PUBLICATIONS

Fischer, M., "Adaptive Repetition Scheme for NGV", 802.11-19/0784r0, May 2019.

U.S. Appl. No. 17/006,998, filed Aug. 31, 2020, entitled "Wireless Communication With Repetition Detection".

Final office action dated May 11, 2022 in U.S. Appl. No. 17/006,998.

Notice of Allowance in U.S. Appl. No. 17/006,998 dated Nov. 2, 2022, 33 pages.

* cited by examiner

WIRELESS COMMUNICATION WITH TIME-DELAY REPETITION DETECTION

CROSS-REFERENCE TO RELATED APPLICATIONS

This application claims the priority under 35 U.S.C. § 119 of European Patent application no. 19306166.0, filed on 23 Sep. 2019, the contents of which are incorporated by reference herein.

OVERVIEW

Aspects of various embodiments are directed to apparatuses and methods for assessing communications for repetition based on semblance between respective data symbols of data messages.

Wireless communications are used to pass information between transmitters and receivers. For instance, transmissions involving vehicle-to-everything (V2X) communications involve transmission and reception between a vehicle and another entity, and vice versa. As vehicles (e.g., stations) employing V2X can utilize different standards of communication, with a mix of vehicles using older and newer standards operating in the same band and/or channel, ensuring compatibility can be important. For instance, new standards messages may re-use the same structure (e.g., preamble followed by data section) than the older standard messages, even though sent at a different transmit rate or repeated multiple times. Therefore, some messages are new, whereas others may be repetitions of a previous message. Further, while V2X communications have been useful, it can be challenging to ensure that transmissions are accurate and efficient.

These and other matters have presented challenges to efficiencies of wireless vehicular communications implementations, for a variety of applications.

SUMMARY

Various example embodiments are directed to issues such as those addressed above and/or others that may become apparent from the following disclosure concerning repetitive communications, and to determining whether communications are repeated from a previous communication. Various such approaches involve making such a determination using a time between received messages. In certain example embodiments, aspects of the present disclosure involve determining whether communications are repetitions based on the time delay between the messages, and corresponding time delays associated with the communication of new messages (e.g., for a transmitter ascertaining a channel and transmitting a new message). These approaches may facilitate rapid identification of an incoming packet and reduce the need for resources, such as buffer size and computing resources.

As may be implemented in accordance with a more specific embodiment, a method is carried out as follows. Data packets that use a first time delay are received from a transmitter, the first time delay being relative to transmission of a previous data packet by a different transmitter. Repetitions of data packets that use a second time delay are received from a transmitter (the same or different transmitter), the second time delay being less than the first time delay and relative to transmission of a previous data packet by the same transmitter that transmits the repetition. It is determined whether received data packets are a repetition of an immediately previous data packet, based on a time delay between the data packet and the immediately previous data packet, relative to the first and second time delays.

Another embodiment is directed to an apparatus having a wireless communications receiver and a decoding circuit. The receiver is configured to receive, from a transmitter, data packets that use a first time delay relative to transmission of a previous data packet by a different transmitter. The receiver is further configured to receive, from a transmitter (which may be the same or a different transmitter), repetitions of data packets that use a second time delay relative to transmission of a previous data packet by the same transmitter that transmits the repetitions, the second time delay being less than the first time delay. The decoding circuit is configured to determine whether a data packet received via the receiver is a repetition of an immediately previous data packet, based on a time delay between the data packet and the immediately previous data packet, relative to the first and second time delays.

Another embodiment is directed to an apparatus comprising a transmitter and a receiver, in which the transmitter transmits a first packet and a series of repetitions of the first packet with a fixed time delay between the packets. The receiver is configured to receive the first packet and the series of repetitions and to receive packets from other transmitters that transmit data packets using a time delay relative to transmission of a previous data packet that is longer than the fixed time delay. The receiver further determines whether a received data packet is a repetition based on the fixed time delay and a time delay between the data packet and the immediately previous data packet. In some implementations, the transmitter transmits the first packet using a protocol that specifies respective values for a time delay for transmitting the first packet relative to packets transmitted by the other transmitters, based on priorities assigned to communication types and/or based on randomness (or pseudo-randomness). These respective values are the same as corresponding respective values via which the other transmitters communicate packets.

The above discussion/summary is not intended to describe each embodiment or implementation of the present disclosure. The figures and detailed description also exemplify various embodiments.

BRIEF DESCRIPTION OF FIGURES

Various example embodiments may be more completely understood in consideration of the following detailed description in connection with the accompanying drawings, in which.

Figure 1:
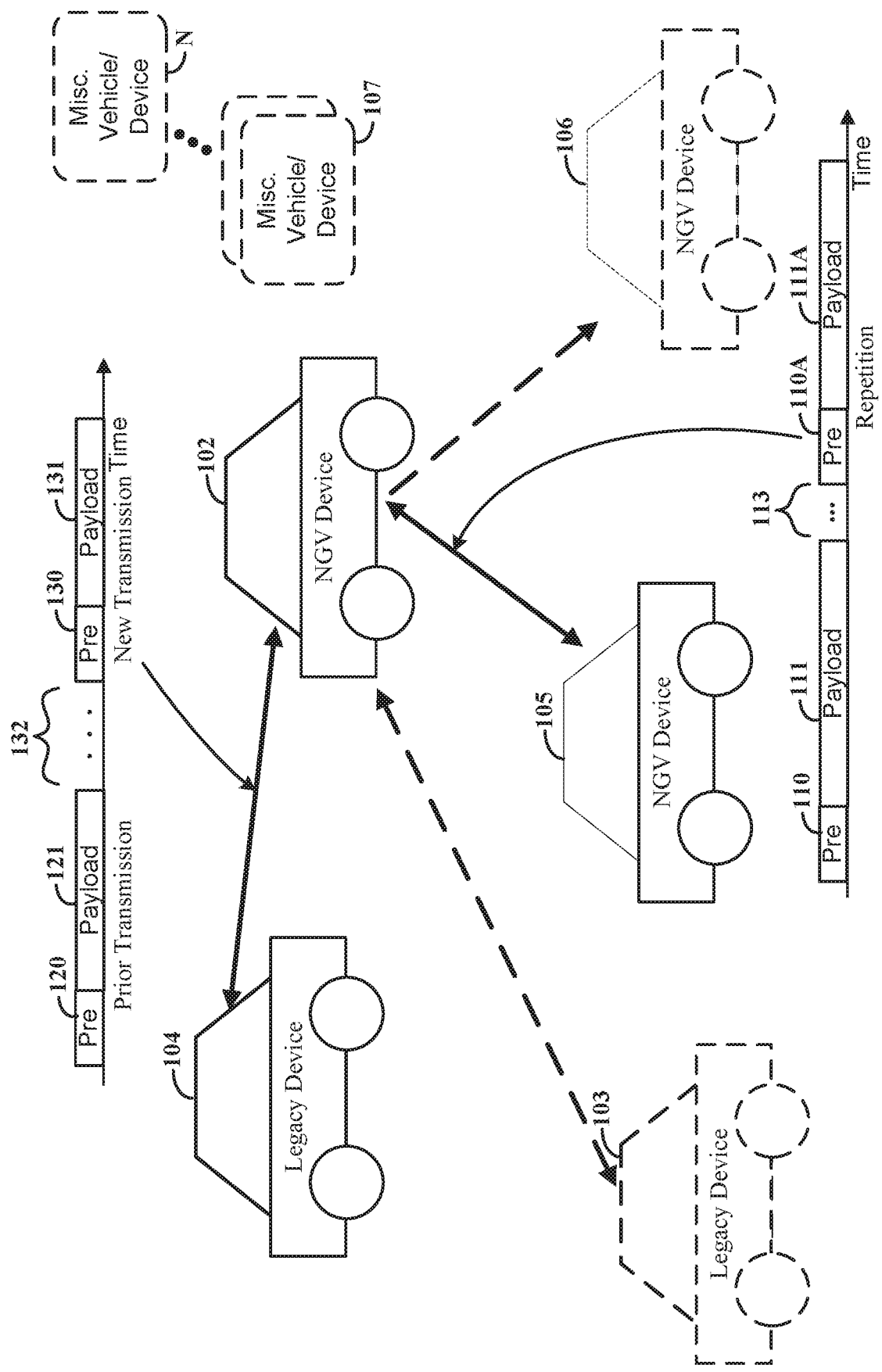
FIG. 1 illustrates an example communications system and approach, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving ascertaining the presence of repetitive communications, such as repetitions. Identifying a communication as being repetitive may facilitate efficient processing while ensuring processing of new communications. In various contexts, aspects of the disclosure are directed to determining whether respective communications are repetitions based upon a time delay between the communications. For instance, a time delay between communications can be compared to a threshold that is set based on an expected time delay between repetitions, and an expected (or range of) time delay between different communications, such as may be implemented for transmissions from different transmitters ascertaining a channel. In certain implementations, aspects of the present disclosure have been shown to be beneficial when used in the context of V2X communications, and in the context of communication environments in which different communication protocols are used. For instance, when protocols evolve, a new protocol may need to operate in a manner that allows older (e.g., legacy) communications and related circuitry to continue to be used, such as when a new protocol may implement repetitions where an older protocol does not. Accordingly, new protocol stations may retransmit a packet, which is encoded as per the legacy standard. The legacy stations may be able to decode each repetition standalone, while new-protocol stations may do advanced combining of the different repetitions for improved performance. Identifying such repetitions may be useful for efficient processing as noted herein.

In various embodiments, the time between consecutive incoming packets can be measured, such as by comparing arrival time of packets based on fine timing offset (FTO) of a given packet. Where time between a packet transmission and transmission of its repetition (and between consecutive repetitions) is constant and known, such timing can be used to identify packets as being repetitions. The time between an initial packet transmission and its repetition, and between further repetitions, can be set such that other transmitters will not transmit packets during such a repetition burst, leaving the repetition burst intact and continuous. Various such approaches are backwards compatible such that transceivers that do not otherwise transmit repetitions may correctly receive an original packet and all its repetitions.

In the following description, various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. In addition, although aspects and features may in some cases be described in individual figures, it will be appreciated that features from one figure or embodiment can be combined with features of another figure or embodiment even though the combination is not explicitly shown or explicitly described as a combination.

As may be implemented with various embodiments, a timing offset (TO) calculation is made for a current packet and TO-based end-of-packet calculations of a previous packet to calculate an interpacket gap, which is used for unambiguous repetition recognition. The repetition recognition considers state of cyclic redundancy check (CRC) decoding of the previous packet as well as the state of a current signal field decoding for deciding when a repetition burst has started and ended, and further to skip decoding when a packet has been previously correctly decoded. If use of the signal field fails, a maximum length of a packet can be stored, and signal fields can be combined to decode the length. In certain aspects, the interpacket gap is determined based on the short interframe space (SIFS), which may for instance be equal to 32 psec in 10 MHz mode, and which relates to an amount of time for a wireless communications circuit to process a received message and time to have an uninterruptable repetition burst.

In a particular embodiment, a transmitter is set to transmit packets belonging to a repetition series all at the same, fixed time interval, which may be referred to as an interpacket gap. For a current packet, its Absolute Timing Offset (ATO) is calculated during preamble processing prior to decoding a data portion of the packet, and is used to determine whether the packet is a repetition of a previous packet or a new packet. The previous packet absolute end (END) may be subtracted from the ATO of the current packet, to provide an estimate of the interpacket gap (GAP), which may be compared with a threshold for determining whether the packet is a repetition or a new packet. This threshold may be, for example, set relative to the fixed interpacket gap, and a longer time delay used for communicating new packets.

A particular embodiment is carried out as follows. If a packet is identified in this regard as a new packet, it is decoded as a standalone packet. If the packet has been decoded correctly (e.g., CRC ok) the packet END (Absolute END=ATO+Packet Length) is stored along with the status of the decoding. If a packet fails decoding (e.g., CRC error), the END, the status of the decoding, and the whole encoded packet is stored. If a packet is a repetition (part of repetition burst), the status of the decoding of the previous packet in the repetition burst is checked. If the previous packet in the repetition burst was received correctly, the current packet decoding may be skipped, and the END value may be stored. If the previous packet in the repetition burst was received incorrectly, the previous packet may be combined with the current packet for decoding stages such as may pertain to a signal field and data (payload) in the packet. If the packet has been decoded correctly (e.g., CRC ok) the END and the status of the decoding is stored. If the packet failed decoding (e.g., CRC error) the END, the status of the decoding, and the required data from the packet to perform combining are stored.

The interpacket gap for repetition bursts can be set to identify repetitions and for the repetition burst not to be interrupted by transmission of another packet by another receiver. Accordingly, the interpacket gap for repetitions may be set less than a minimum transmit interpacket time allowed for new packets to be transmitted, which may be represented by $$AIFS = N * T \times Slot + SIFS,$$

where AIFS is the arbitration interframe spacing that specifies an amount of time (e.g., delay) for transmitting new packets of respective communication types. For instance, the AIFS may be as low as 58 psec in the case of high-priority messages, and higher for lower-priority messages. The interpacket gap may further be set to be equal to or more than the minimum interpacket receive time required a represented by SIFS, as characterized above. Accordingly, the interpacket gap for repetitions may be set such that it is greater than or equal to SIFS, and less than AIFS. The interpacket gap can be set to an amount less than AIFS to provide some assurance that receiver calculations of interpacket gaps (for detecting repetition) will be sufficient such that the repetitions maintain arbitration of a particular channel being used, for example, despite noise or other communication issues.

Various embodiments are directed to communications involving vehicles, such as automobiles, trains or boats, and other stations/devices may be implemented with a drone, a bicycle, a pedestrian and/or a traffic controller, may be in dynamic communication environments (e.g., in which some communications circuits are moving relative to one another) and include communications circuitry for wirelessly communicating with other stations using a communication protocol, sometimes herein referred to as vehicle-to-everything (V2X) communications. In such contexts, some exemplary implementations can utilize wireless communications in accordance with various standards, such as the IEEE 802.11-OCB standard, which may be referred to as IEEE 802.11p, or as otherwise specified in the IEEE 802.11-2016 specification, or newer protocols such as IEEE 802.11bd (sometimes denoted as new generation vehicle (NGV)), which is fully incorporated herein by reference (e.g., for implementation of communication protocols and approaches with FIGS. 1-2).

Various embodiments involve the use of standards such as IEEE 802.11bd, a 3GPP 4G LTE-V2X and/or 3GPP 5G NR standard. The standard features may improve overall system effectiveness, while remaining compatible with earlier devices, such as "legacy IEEE 802.11p" devices. As may be appreciated, legacy devices may include or refer to devices in the field that provide V2X using an older standard, such as IEEE 802.11p. Accordingly, various aspects herein are directed to facilitating communications such as repetitive communications, while maintaining compatibility for receiving communications using an older standard.

As may be implemented in accordance with a more specific embodiment, a method is carried out as follows. Data packets using a first time delay relative to previously transmitted packets are received from a transmitter, and repetitions of data packets that use a second time delay relative to previously transmitted packets are received from a transmitter (the same or different transmitter). The second time delay is less than the first time delay and relative to transmission of a previous data packet by the same transmitter that transmits the repetition. Received data packets are determined to be a repetition of an immediately previous data packet based on a time delay between the data packet and the immediately previous data packet, relative to the first and second time delays. The time delay may be determined by subtracting a timing offset of the data packet calculated during processing of a preamble of the data packet, from an end time of the immediately previous data packet. Further, data packet determined to be a new data packet relative to the immediately previous data packet via the time delay may be decoded as a standalone data packet.

The data packets may, for example, be communicated using a protocol that specifies a minimum value for the second time delay as pertaining to repeated data packets, and that specifies respective values for the first time delay that are based on priorities assigned to communication types. In various contexts, this approach may involve transmissions of new packets from newer and older (e.g., legacy) transmitters that gain arbitration of a channel (and that use different protocols), and transmissions of packet repetitions from newer transmitters. The new packets may be transmitted according to an AIFS as noted above, and the packet repetitions may be translated with a delay that is less than AIFS, and relative to SIFS. A time delay of received packets may be compared to a threshold that is relative to AIFS-SIFS, determining whether a received data packet is a repetition of an immediately-previous data packet, based on a time delay between the data packet and the immediately-previous data packet, relative to the first (AIFS) and second (SIFS) time delays. In these contexts, the time delays may be based on a variable AIFS (e.g., based on communication type) plus a variable number of time slots. This may be based on, for instance, the IEEE 802.11p protocol backoff procedure, which a transceiver uses to obtain arbitration of a channel once channel is idle (e.g., by counting down for a backoff period relative to a message priority type before transmitting).

In a more particular embodiment, the data packets are transmitted according to a protocol that specifies a minimum value for the time delay pertaining to repeated data packets, and that specifies respective values for the time delay for new packets, which are based on priorities assigned to communication types for transmitters gaining access to a channel. Received data packet are recognized as being a repetition of an immediately-previous data packet by comparing the time delay to a threshold time delay that is less than a minimum value set for new packets (e.g., a set AIFS for highest-priority communication), and equal to or greater than the time delay for repetitions.

Determining whether received data packets are a repetition of an immediately previous data packet may be carried out in a variety of manners. In some implementations, data packet are determined to be a repetition in response to the time delay being less than a threshold time delay value between the first delay and the second time delay. In other implementations, the time delay between receipt of a first symbol of a data packet being evaluated for repetition, and completion of the receipt of the immediately previous data packet, is compared with a threshold time delay set based on the first and second time delays (e.g., roughly between the first and second time delays). The data packet being evaluated is determined to be a repetition in response to the comparing indicating that the time delay is less than the threshold time delay.

The time delay may be implemented in a variety of manners. In some implementations, the first time delay is set based on a time for a transmitter to ascertain control of a channel via which a previous transmitter completed the previous packet transmission, and a priority associated with a type of communication to be made. In certain implementations, the second time delay is a predefined minimum time delay set for a communication protocol defined for transmitters and receivers operating on a channel, and the first time delay is based on the predefined minimum time delay with additional time for transmitters to ascertain and transmit a communication on the channel after another transmitter has completed a communication on the channel.

Data packets determined to be a repetition can be processed in a variety of manners. In some embodiments, when the immediately previous data packet was decoded improperly, the repetition is decoded and combined with the decoding of the immediately previous data packet. In other embodiments, when the immediately previous data packet was decoded properly, processing of the repetition is terminated.

Another embodiment is directed to an apparatus having a wireless communications receiver and a decoding circuit. The receiver receives data packets (from a transmitter) that use a first time delay relative to transmission of a previous data packet by a different transmitter. The receiver also receives repetitions of data packets (from the same or a different transmitter) that use a second time delay relative to transmission of a previous data packet. This second time delay is less than the first time delay. The decoding circuit determines whether a data packet received via the receiver is a repetition of an immediately previous data packet, based on a time delay between the data packet and the immediately previous data packet, relative to the first and second time delays. For instance, the decoding circuit may determine that a data packet is a repetition of an immediately previous data packet in response to the time delay being less than a threshold time delay value between the first delay and the second time delay. The time delay may be determined by subtracting a timing offset of the data packet calculated during processing of a preamble of the data packet, from an end time of the immediately previous data packet. The decoding circuit may further determine that the received data packet is a new data packet relative to the immediately previous data packet based on the time delay and, decode the new data packet as a standalone data packet in response thereto.

In some implementations, the decoding circuit determines whether the received data packet is a repetition of an immediately previous data packet by comparing the time delay between the data packet and the immediately previous data packet to a threshold time delay. This threshold time delay may be set as less than a minimum value set by a protocol for the first time delay and greater than the first time delay. The protocol also specifies a minimum value for the second time delay for repetitions, and specifies respective values for the first time delay that are based on priorities assigned to communication types for transmitters gaining access to a channel. This may be carried out using SIFS and AIFS in a manner depicted elsewhere herein.

In other embodiments, the decoding circuit determines whether the received data packet is a repetition of the immediately previous data packet by comparing the time delay between receipt of a first symbol of the received data packet and completion of the receipt of the immediately previous data packet, with a threshold time delay that is set based on the first and second time delays (and that is between the first and second time delays). The received data packet is determined to be a repetition of the immediately previous data packet if the time delay is less than the threshold time delay.

Repetitions may be combined in a variety of manners. For instance, if the decoding circuit determines that the received data packet is a repetition of the immediately previous data packet and the immediately previous data packet has been decoded improperly, the repetition may be decoded and combined with the immediately previous data packet.

Turning now to the figures, FIG. 1 illustrates an example wireless communications system and approach involving the communication of data messages in which some messages are repetitive. A plurality of vehicles 102-106 as well as miscellaneous vehicles/devices 107-N are shown, some or all of which may participate in communications. In the context of various embodiments, the vehicles and/or miscellaneous vehicles/devices may include automobiles, trains, boats, bicycle and/or pedestrian devices (e.g., mobile telephones or wearables), or non-mobile devices such as may be implemented with road side units or traffic controllers (e.g., stoplights, gates, bridges, and train crossings). Each such vehicle/device can include a station that effects communications as characterized herein.

In a particular embodiment, vehicle 102 communicates with vehicles operating using different protocols, including vehicle 104 operating with a (first) legacy communication protocol and vehicle 105 operating with a (second) NGV communication protocol. Vehicle 102 may also operate in more populated environments involving one of more of vehicles 103 and/or 106 and miscellaneous vehicles/devices 107-N. Receiver circuitry in vehicle 102 collects information wirelessly from transmissions associated with the legacy communication protocol (at least from vehicle 104) and from transmissions associated with another communication protocol (at least from vehicle 105), which may be over a particular wireless communications channel. Other transmissions according to the legacy communication protocol may be received from vehicle 103 or one or more of miscellaneous vehicle/devices 107-N. Further transmissions according to the other (e.g., NGV or 3GPP 5G NR) communication protocol may be received from vehicle 106 or one or more of miscellaneous vehicles/devices 107-N, some or all of which may also communicate via the legacy communication protocol.

Vehicles 102, 105 (and 106 when implemented), as well as one or more of the devices 107-N, use repetitive communications in accordance with one or more embodiments as characterized herein. Referring to vehicle 102, received communications are assessed to determine whether those communications are repetitions based on a time delay between received packets and an immediately previous packet. Such an assessment may involve using a threshold as characterized herein, with specific implementations directed to use of a threshold based on SIFS and a minimum AIFS as may be variable to facilitate communication priorities. By way of example, a new transmission having preamble and payload 110 and 111 is shown along with its repetition 110A and 111A, which uses a gap 113 set for repetitions. A new transmission having preamble 130 and payload 131 is also shown, which uses a gap 132 set for communication after previous transmissions as represented by transmission having preamble 120 and payload 121.

Referring to the new transmission (130/131) as shown by way of example as being received from the legacy device in vehicle 104, a receiver in vehicle 102 calculates or estimates a time gap for the time between the initial receipt of the preamble 130 and an end time of the payload 121 of the prior transmission. This prior transmission may originate, for example, from a different transmitter in vehicle 103. The receiver in vehicle 102 compares the time gap to a threshold time gap value, which is set to differentiate between new messages using relatively long time gaps between previous messages from other transmitters, and repetitions that use a relatively shorter time gap. As the transmission is a new transmission, the time gap 132 is indicative that the new transmission 130/131 is indeed a new transmission, and the receiver decodes the transmission as a standalone packet.

Referring to the repetition transmission 110A/111A as shown by way of example as being received from an NGV device in vehicle 105, the receiver calculates or estimates a time gap 113 between receipt of the preamble 110 and the end of communication of the payload 111. The time gap 113 is compared to a threshold as noted above and, as the communication is a repetition, the comparison indicates so and the receiver processes the repetition accordingly. For instance, as noted above, the repetition may be combined with the decoding of the previous message 110/111 to improve accuracy or, if the previous message was decoded correctly, may be otherwise ignored.

The wireless communications depicted in FIG. 1 may involve V2X communications, which may include multiple types of communications such as: vehicle-to-vehicle (V2V), vehicle-to-infrastructure (V2I), vehicle-to-network, (V2N) and vehicle-to-pedestrian (V2P). In specific instances, a V2X network may enable an exchange of information between a plurality of vehicles and, in some instances, other devices. As may be appreciated, as used herein "circuitry" refers to one or more circuits, such as a plurality of similarly operating (or version of) circuits operating in respective vehicles, one or more of which may involve programmable devices utilizing software. The vehicles can communicate messages to one another, such as speed measurements, communication measurements. GPS data, etc., via the vehicular communications circuits.

The communication protocol technologies characterized herein, including legacy and other/NGV technologies, may be IEEE 802.11-based technology, such as IEEE 802.11p or other Wi-Fi technology. Referring to FIG. 1, each of the newer standard and older standard devices/vehicles may thus be implemented with communications circuitry that wirelessly communicates using a communications protocol that is consistent with Wi-Fi or IEEE 802.11p-based communications. The communications protocols used may involve sending messages asynchronously. For example, communications circuitry can observe (e.g., listen) the channel and communicate in response to the channel being clear (e.g., no messages being transmitted).

Figure 2:
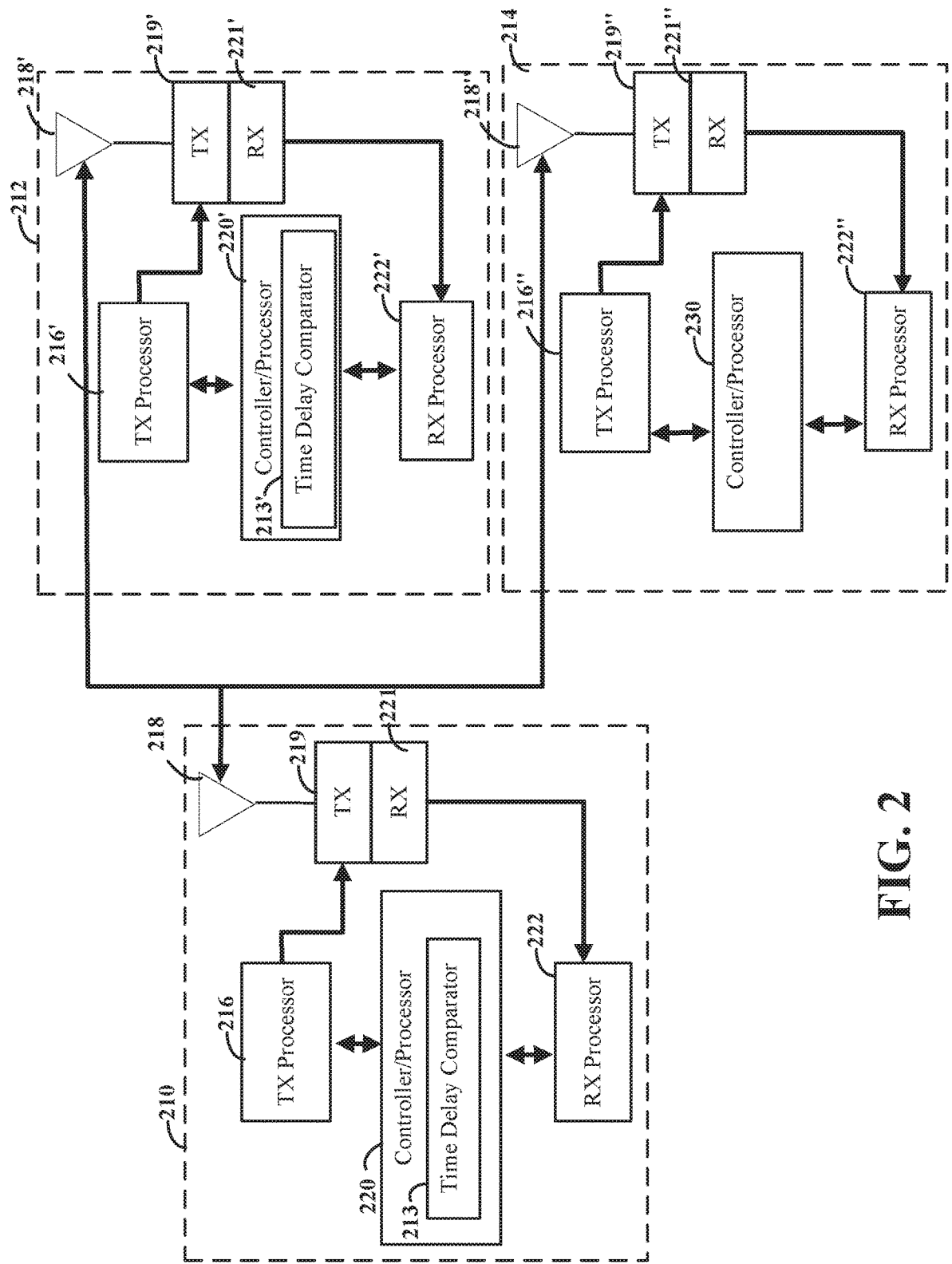
FIG. 2 illustrates example communications circuitry of a plurality of stations, in accordance with the present disclosure.

FIG. 2 illustrates example communications circuits 210, 212 and 214 of respective stations, in accordance with various embodiments. Each of communications circuits 210, 212 and 214 can communicate wirelessly in a wireless communications network using a communications protocol. Communications circuit 210 and 212 operate according to a first (e.g., newer/other) communication type (e.g., standard), and communications circuitry 214 that operates according to a second (e.g., older/legacy) communication type. Referring by way of example to FIG. 1, circuit 210 may be implemented with vehicle 102, circuit 212 may be implemented with vehicle 105, and circuit 214 may be implemented with vehicle 104.

The communications circuits 210, 212, 214 include certain common circuitry types as may be implemented similarly. The first communications circuit 210 includes a transmit (TX) processor 216 and receive (RX) processor 222 used with a controller/processor 220 (as may assess time delays for repetition detection) to implement various functionality for transmitting and receiving messages in accordance with both legacy and newer/other communication protocols. The first communications circuitry 210 also includes transmitter 219, receiver 221, and antenna 218.

The communications circuits 212 and 214 also include similar components, with corresponding notations used (e.g., 218' and 218" denoting antennas). For communications circuits 210 and 212, the controller/processor 220 and controller/processor 220' also include time delay comparators 213 and 213' that provide a comparison or other evaluation of time delay between packets for detecting repetitions, as characterized with one or more embodiments herein. The communications circuit 214 is shown with controller/processor 230 (different that 220 and 220'), operable to transmit and receive (and decode) signals in accordance with a second protocol. As such, communications circuits 210 and 212 are backwards compatible for communicating with communications circuits 214.

Each of the communications circuits 210, 212, 214 may communicate wirelessly using a communications protocol in which messages are sent asynchronously and over the same channel. The messages can each have a preamble that includes a legacy short training field (L-STF) that provides support of synchronization and automatic gain control (AGC) calibration (e.g., which can be 8 psec), a legacy long training field (L-LTF) that provides channel estimation pilot for decoding subsequent Wi-Fi-based symbols (e.g., which can be 16 psec), and a signal field (SIG) symbol that conveys the MCS (e.g., which can be 8 psec).

Accordingly, communications circuit 210 may assess messages received via its antenna 218, receiver 221 and receive processor 222, implementing its controller processor 220 and time delay comparator 213 to assess time delays for messages received from circuits 212 and 214 (and others), for determining whether packets are repetitions. For instance, when either circuit 212 or 214 ascertains control of a channel and sends a new message, the new message may be detected as being new (relative to a repetition) when the time delay relative to a previous message is greater than (or equal to) a threshold. Repetitions of new messages may be detected when their time delay relative to the previous message (e.g., a new message or an earlier repetition) is less than (or equal to) the threshold. In this context, it should be appreciated that the threshold may be set either higher or lower, relative to use of a less than/greater than (or equal to) comparison.

Communications (and as may be applicable, communication networks) are not limited to the number of stations and/or communications circuitries as illustrated by FIGS. 1 and 2. Various embodiments can include greater or fewer stations having communications circuitries in a shared device geography, and additional or fewer types of stations having communications circuitries (e.g., mobile phones). The number of stations can also change over time due to movement of vehicles or other stations and/or additional stations entering the shared station geography (e.g., forming ad-hoc network(s)).

Figure 3:
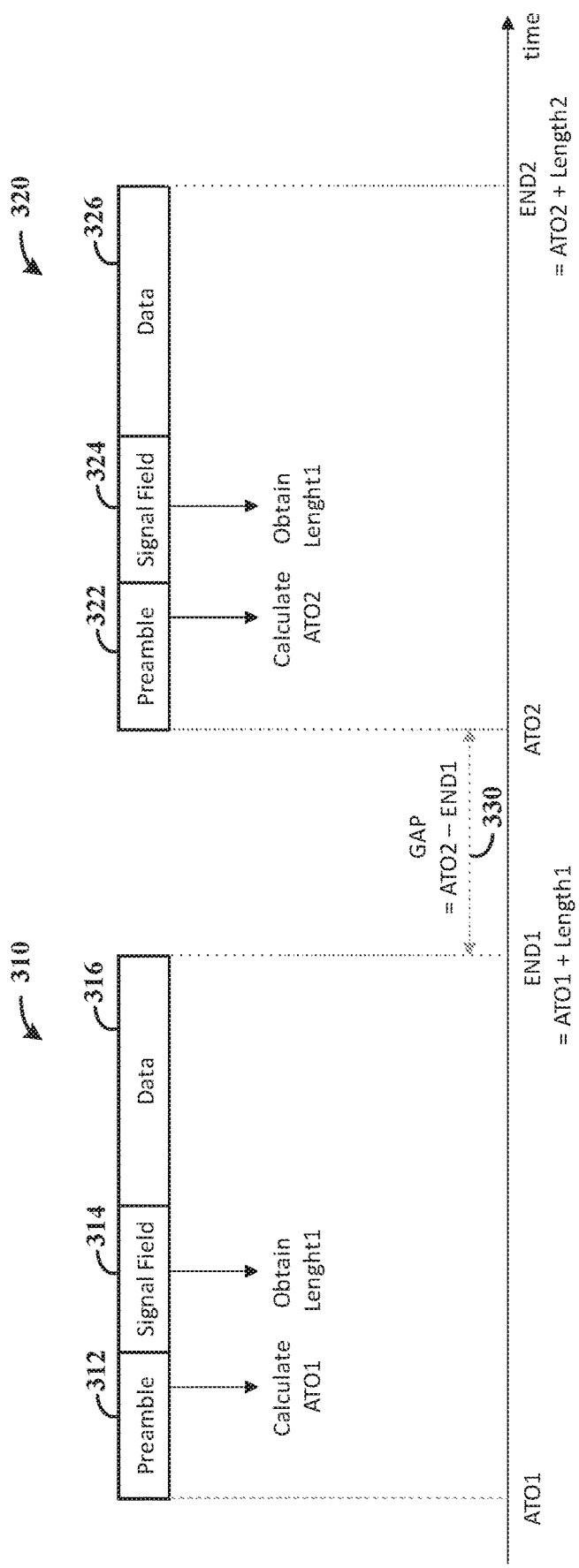
FIG. 3 depicts data packets and related processing for assessing repetition, in accordance with the present disclosure.

FIG. 3 depicts data packets and related processing for assessing repetition, in accordance with the present disclosure. Two data messages, 310 and 320, are shown respectively having preambles 312/322, signal field 314/324, and data field 316/326. An interpacket gap 330 between the messages is set based on whether the data message 320 is new relative to data message 310, or is a repetition of data message 310. The interpacket gap 330 may be estimated by calculating the ATO during processing of the preamble 322 prior to decoding data 326, and subtracting the absolute end (END) time of the packet 310. This estimated gap 330 may be compared with a threshold for determining whether the packet 320 is a repetition of packet 310 or a new packet, in a manner as characterized herein. This threshold may be, for example, set relative to the fixed interpacket gap, and a longer time delay used for communicating new packets.

Figure 4:
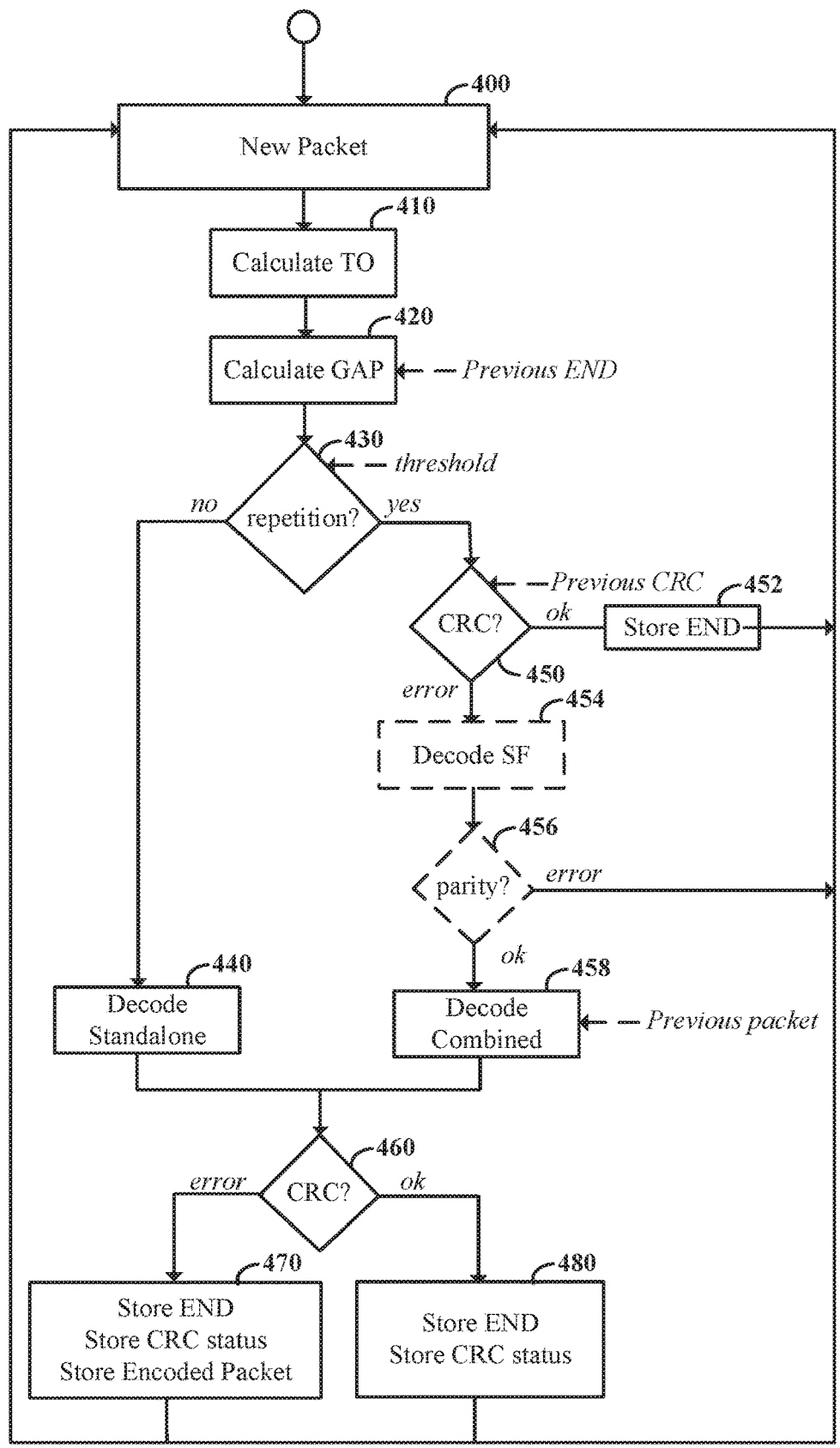
FIG. 4 depicts a data flow approach for assessing repetition, in accordance with the present disclosure.

FIG. 4 depicts a data flow approach for assessing repetition, in accordance with the present disclosure. At block 400, a new packet is received and that packet's TO (timing offset) and gap to a previous packet are calculated at blocks 410 and 420, the latter of which utilizes an END time of a previous packet. The TO may be calculate during preamble processing, as the first calculation that is carried out after packet detection. For instance, the TO may refer to a first sample of the packet that FFT can be performed on and aligned to symbol boundary. The gap is compared to a threshold at 430 to determine whether the packet is a repetition. Expected errors in calculating TO can be considered when setting a threshold comparison.

If the packet is not a repetition, it is decoded at block 440 as a standalone packet. If the packet is a repetition and if the previously received packets' CRC indicates that previous packet was decoded correctly at block 450, an END time of the packet is stored (and further processing may be terminated). If the CRC of the previous packet does not indicate that the previous packet was decoded correctly, the packet is decoded via combination with the previous packet at block 458.

In some implementations, the signal field of the packet is decoded at block 454 and a parity check is performed at block 456, and processing of the packet may be terminated if the parity check indicates an error (or otherwise continues to decoding at block 458). This may be carried out where, for example, an incorrectly received signal field may be required in order to reliably calculate a packet END time.

A CRC check is then performed at block 460. If the CRC check indicates an error in decoding, the END value, CRC status and encoded packet are stored at 470 (and, e.g., that stored packet can be further combined with an additional repetition, if received). If the CRC check indicates an accurate decoding, the END value and CRC status are stored at block 480.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, receiver, decoding circuit, CRC check, and/ or other circuit-type depictions (e.g., reference numerals 210, 220, 222 and 216 of FIG. 2 depict a block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/ activities, as may be carried out in the approaches shown in FIGS. 3-4. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described above and/or with FIGS. 3-4 is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). As another example, where the Specification may make reference to a "first [type of structure]", a "second [type of structure]", etc., where the [type of structure] might be replaced with terms such as ["circuit". "circuitry" and others], the adjectives "first" and "second" are not used to connote any description of the structure or to provide any substantive meaning; rather, such adjectives are merely used for English-language antecedence to differentiate one such similarly-named structure from another similarly-named structure (e.g., "first circuit configured to convert . . . " is interpreted as "circuit configured to convert . . . ").

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, different thresholds may be utilized for ascertaining whether respectively received messages are repetitions or different messages. As another example, time delays may be altered to suit different types of messages and determination of message types (repetition or not) can be carried out accordingly. Such modifications do not depart from the true spirit and scope of various aspects of the disclosure, including aspects set forth in the claims.

What is claimed is:

1. A method comprising:
receiving, from a transmitter, data packets that use a first time delay relative to transmission of a previous data packet by a different transmitter;
receiving, from a transmitter, repetitions of data packets that use a second time delay relative to transmission of a previous data packet by the same transmitter, the second time delay being less than the first time delay; and
determining whether a received data packet is a repetition of an immediately-previous data packet, based on a time delay between the data packet and the immediately-previous data packet, relative to the first and second time delays.

2. The method of claim 1, wherein:
the data packets are transmitted according to a protocol that specifies a minimum value for the second time delay as pertaining to repeated data packets, and that specifies respective values for the first time delay that are based on priorities assigned to communication types for transmitters gaining access to a channel; and
determining whether the received data packet is a repetition of an immediately-previous data packet includes comparing the time delay to a threshold time delay that is less than a minimum value set by the protocol for the first time delay and greater than the first time delay.

3. The method of claim 1, wherein the data packets use a protocol that specifies a minimum value for the second time delay as pertaining to repeated data packets, and that specifies respective values for the first time delay that are based on priorities assigned to communication types.

4. The method of claim 1, wherein determining whether the received data packet is the repetition of the immediately previous data packet includes determining that the data packet is the repetition of the immediately previous data packet in response to the time delay being less than a threshold time delay value between the first delay and the second time delay.

5. The method of claim 1, wherein determining whether the received data packet is the repetition of the immediately previous data packet includes:
comparing the time delay between receipt of a first symbol of the received data packet and completion of the receipt of the immediately previous data packet, with a threshold time delay that is set based on the first and second time delays, the threshold time delay being between the first and second time delays, and determining that the received data packet is the repetition of the immediately previous data packet in response to the comparing indicating that the time delay is less than the threshold time delay.

6. The method of claim 1, wherein the first time delay is set based on a time for a transmitter to ascertain control of a channel via which a previous transmitter completed the previous packet transmission, and a priority associated with a type of communication to be made.

7. The method of claim 1, wherein
the second time delay is a predefined minimum time delay set for a communication protocol defined for transmitters and receivers operating on a channel; and
the first time delay is based on the predefined minimum time delay with additional time for transmitters to ascertain and transmit a communication on the channel after another transmitter has completed a communication on the channel.

8. The method of claim 1, further including:
determining the time delay by subtracting a timing offset of the data packet calculated during processing of a preamble of the data packet, from an end time of the immediately previous data packet; or
determining that the received data packet is a new data packet relative to the immediately previous data packet based on the time delay and, in response, decoding the new data packet as a standalone data packet.

9. The method of claim 1, further including, in response to determining that the received data packet is a repetition of the immediately previous data packet and to the immediately previous data packet being decoded improperly:
decoding the repetition of the immediately previous data packet; and
combining the decoded repetition of the immediately previous data packet with the decoding of the immediately previous data packet.

10. The method of claim 1, further including, in response to determining that the received data packet is a repetition of the immediately previous data packet and to the immediately previous data packet being decoded properly, terminating processing of the received data packet for decoding.

11. An apparatus comprising:
a wireless communications receiver to:
receive, from a transmitter, data packets that use a first time delay relative to transmission of a previous data packet by a different transmitter, and
receive, from a transmitter, repetitions of data packets that use a second time delay relative to transmission of a previous data packet by the same transmitter, the second time delay being less than the first time delay; and
a decoding circuit configured to determine whether a data packet received via the receiver is a repetition of an immediately-previous data packet, based on a time delay between the data packet and the immediately-previous data packet, relative to the first and second time delays.

12. The apparatus of claim 11, wherein:
the decoding circuit is configured to determine whether the received data packet is a repetition of an immediately-previous data packet by comparing the time delay between the data packet and the immediately-previous data packet to a threshold time delay, the threshold time delay being less than a minimum value set by a protocol for the first time delay and greater than the first time delay; and the protocol specifies a minimum value for the second time delay for repetitions, and specifies respective values for the first time delay that are based on priorities assigned to communication types for transmitters gaining access to a channel.

13. The apparatus of claim 11, wherein the decoding circuit is configured to determine whether the received data packet is the repetition of the immediately previous data packet by:
comparing the time delay between receipt of a first symbol of the received data packet and completion of the receipt of the immediately previous data packet, with a threshold time delay that is set based on the first and second time delays, the threshold time delay being between the first and second time delays, and
determining that the received data packet is the repetition of the immediately previous data packet in response to the comparing indicating that the time delay is less than the threshold time delay.

14. The apparatus of claim 11, wherein the decoding circuit is configured to:
determine the time delay by subtracting a timing offset of the data packet calculated during processing of a preamble of the data packet, from an end time of the immediately previous data packet; or
determine that the received data packet is a new data packet relative to the immediately previous data packet based on the time delay and, in response, to decode the new data packet as a standalone data packet.

15. The apparatus of claim 11, wherein the decoding circuit is configured to, in response to determining that the received data packet is a repetition of the immediately previous data packet and to the immediately previous data packet being decoded improperly:
decode the repetition of the immediately previous data packet; and
combine the decoded repetition of the immediately previous data packet with the decoding of the immediately previous data packet.

16. An apparatus comprising:
a transmitter configured to transmit a first packet and a series of repetitions of the first packet with a fixed time delay between the packets;
a receiver configured to:
receive the first packet and the series of repetitions,
receive packets from other transmitters that transmit data packets using a time delay relative to transmission of a previous data packet that is longer than the fixed time delay, and
determine whether a received data packet is a repetition based on the fixed time delay and a time delay between the received data packet and the immediately-previous data packet.

17. The apparatus of claim 16, wherein the transmitter is further configured to transmit the first packet using a protocol that specifies respective values for a time delay for transmitting the first packet relative to packets transmitted by the other transmitters based on priorities assigned to communication types, the respective values being the same as corresponding respective values via which the other transmitters communicate packets.

18. The apparatus of claim 17, wherein the receiver is further configured to determine whether the received data packet is a repetition of an immediately-previous data packet by comparing the time delay to a threshold time delay that is less than a minimum value set by the protocol.

19. The apparatus of claim 16, wherein the transmitter is further configured to set the fixed time delay based on a time for a transmitter to ascertain control of a channel via which a previous transmitter completed the previous packet transmission.

20. The apparatus of claim 16, wherein the receiver is further configured to terminate processing of the received data packet for decoding based on whether the received data packet is a repetition.

\* \* \* \* \*